United States Patent
Tanaka

(10) Patent No.: US 7,809,034 B2
(45) Date of Patent: Oct. 5, 2010

(54) AUTO-POWER CONTROL CIRCUIT TO MAINTAIN EXTINCTION RATIO OF OPTICAL OUTPUT FROM LASER DIODE

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/071,056

(22) Filed: Feb. 14, 2008

(65) Prior Publication Data

US 2008/0212628 A1    Sep. 4, 2008

(30) Foreign Application Priority Data

Feb. 16, 2007    (JP) .................... 2007-036901

(51) Int. Cl.
*H01S 3/00*    (2006.01)
(52) U.S. Cl. .................. 372/38.01; 372/29.011; 372/29.021; 372/31; 372/38.02; 372/38.07; 372/38.09
(58) Field of Classification Search ........... 372/29.011, 372/29.012, 29.014, 29.015, 29.021, 31, 372/38.1–38.09
See application file for complete search history.

(56) References Cited

U.S. PATENT DOCUMENTS

| | | | | |
|---|---|---|---|---|
| 6,909,731 | B2 * | 6/2005 | Lu ................... | 372/29.01 |
| 6,975,658 | B1 * | 12/2005 | Roach .............. | 372/29.02 |
| 2002/0009109 | A1 * | 1/2002 | Asano .............. | 372/38.02 |

FOREIGN PATENT DOCUMENTS

| JP | 11-112437 | 4/1990 |
|---|---|---|
| JP | 2004-87845 | 3/2004 |

* cited by examiner

*Primary Examiner*—Tod T Van Roy
(74) *Attorney, Agent, or Firm*—Smith, Gambrell & Russell, LLP

(57) ABSTRACT

The present invention provides an auto-power control (APC) circuit and a method to stabilize the extinction ratio of an optical output from a laser diode (LD) in an optical transmitter. The APC circuit according to the invention includes two feedback loops for the modulation $I_M$ and the bias current $I_B$ each having variable loop gain. The extinction ratio of the optical output from the LD is kept constant by setting the ratio of the loop gains of respective APC circuits to be ER−1.

8 Claims, 8 Drawing Sheets

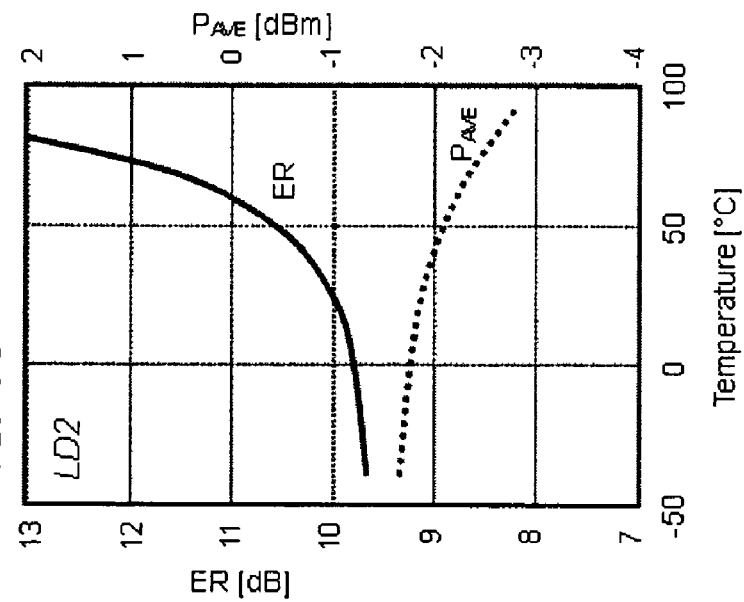
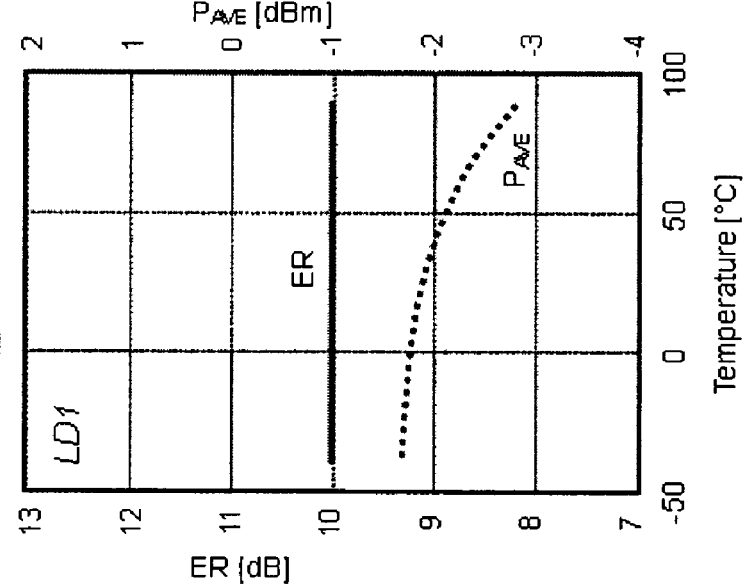
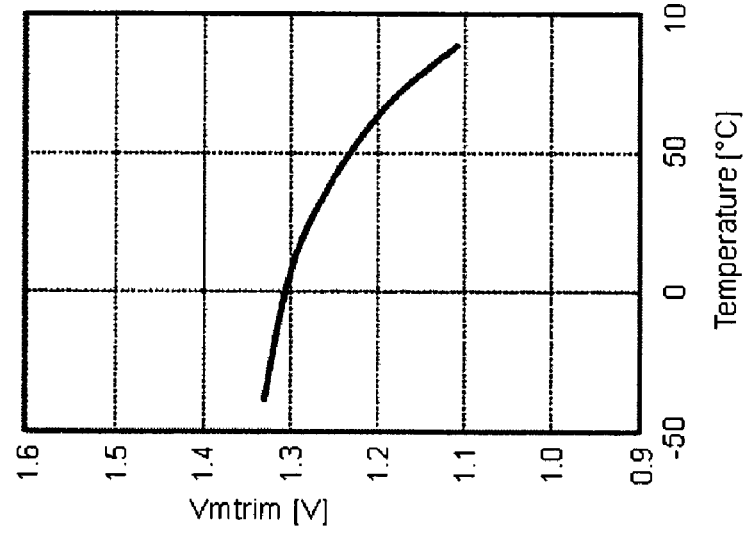

AUTO-POWER CONTROL CIRCUIT TO MAINTAIN EXTINCTION RATIO OF OPTICAL OUTPUT FROM LASER DIODE

BACKGROUND OF THE INVENTION

1. Field of the Invention

The present invention relates to an auto-power control (APC) circuit to control the bias and the modulation currents provided to a laser diode (LD) so as to maintain the extinction ratio of the optical output from the LD, and the optical transmitter implementing the APC circuit.

2. Related Prior Art

Japanese Patent Applications published as JP-2004-087845A and JP-H11-112437A have disclosed optical transmitters with a conventional APC circuit. FIGS. 7A and 7B illustrate the conventional optical transmitter 100 and the APC circuit 116 implemented in the transmitter, which are disclosed in JP-2004-0987845A, in which the LD is coupled with the driver circuit in the AC coupling mode. The APC circuit 116 includes a monitoring photodiode (PD) 103 that converts an average optical power to a photocurrent corresponding to the average optical power and the bias generator. The bias generator, by receiving the photocurrent, sets the bias voltage provided to the LD. In this conventional APC circuit 116, external control signals and additional circuits for adjusting the temperature characteristic of the LD are necessary to adjust the bias voltage so as to compensate the dispersion of the threshold current and the slope efficiency of the LD, and the temperature dependence thereof under controlled.

FIG. 8 illustrates another conventional optical transmitter 101, which is disclosed in the JP-H11-112437A, to stabilize the average optical output power from the LD 111. The APC circuit detects the optical output by the monitoring PD 113 that generates the photocurrent $I_{PD}$, and both the bias $I_B$ and the modulation currents $I_M$ provided to the LD 111 are feedback controlled by the photocurrent $I_{PD}$ from the PD so as to compensate the dispersion in the threshold current and the slope efficiency of the LD.

However, the APC circuits disclosed in prior documents are necessary to adjust the external reference signals to compensate the dispersion of the characteristics of individual LDs, which brings complex procedures to get a performance of the optical transmitter.

SUMMARY OF THE INVENTION

One aspect of the present invention relates to a method to keep an extinction ratio of an optical output from a laser diode by an auto-power control circuit with feedback loops individually for a bias current and a modulation current. The method comprises steps of (a) setting the closed loop gain of the first feedback loop for the bias current to a first value; and (b) setting the closed loop gain of the second feedback loop for the modulation current to a second value. In the method according to the present invention, a ratio of the second value to the first value is related to the extinction ratio. Specifically, the ratio $G_M/G_B$, where $G_M$ is the loop gain of the second closed loop for the modulation current and the $G_B$ is the loop gain of the first closed loop for the bias current, is set to be $G_M/G_B = ER-1$, where ER is the extinction ratio.

An other aspect of the invention relates to an optical transmitter that provides an auto-power control (APC) circuit for a semiconductor laser diode emitting light by being supplied with a bias current and a modulation current. The APC circuit includes a first closed loop with a first loop gain to adjust the bias current and a second closed loop with a second loop gain to adjust the modulation current. In the present invention, a ratio of the second loop gain $G_M$ to the first loop gain $G_B$ is related with the preset extinction ratio for the laser diode. Specifically, the ratio, $G_M/G_B$ is set to ER−1. The APC loop of the invention adjusts the bias and the modulation currents accordingly, the extinction ratio of the optical output emitted from the laser diode may be kept constant with respect to not only the temperature but also the unevenness of device characteristics.

BRIEF DESCRIPTION OF DRAWINGS

FIG. 4A shows a behavior of the external reference Vmtrim to keep the extinction ratio of the first diode when the gains of respective feedback loops for the modulation and the bias currents are set to be equal to each other, and FIGS. 4B and 4C show behaviors of the extinction ratio and the average optical output of the first and the second diodes, respectively, when the external reference Vmtrim is varied as those shown in FIG. 4A;

DESCRIPTION OF PREFERRED EMBODIMENTS

Next, preferred embodiments according to the present invention will be described in detail as referring to accompanying drawings.

Figure 1:
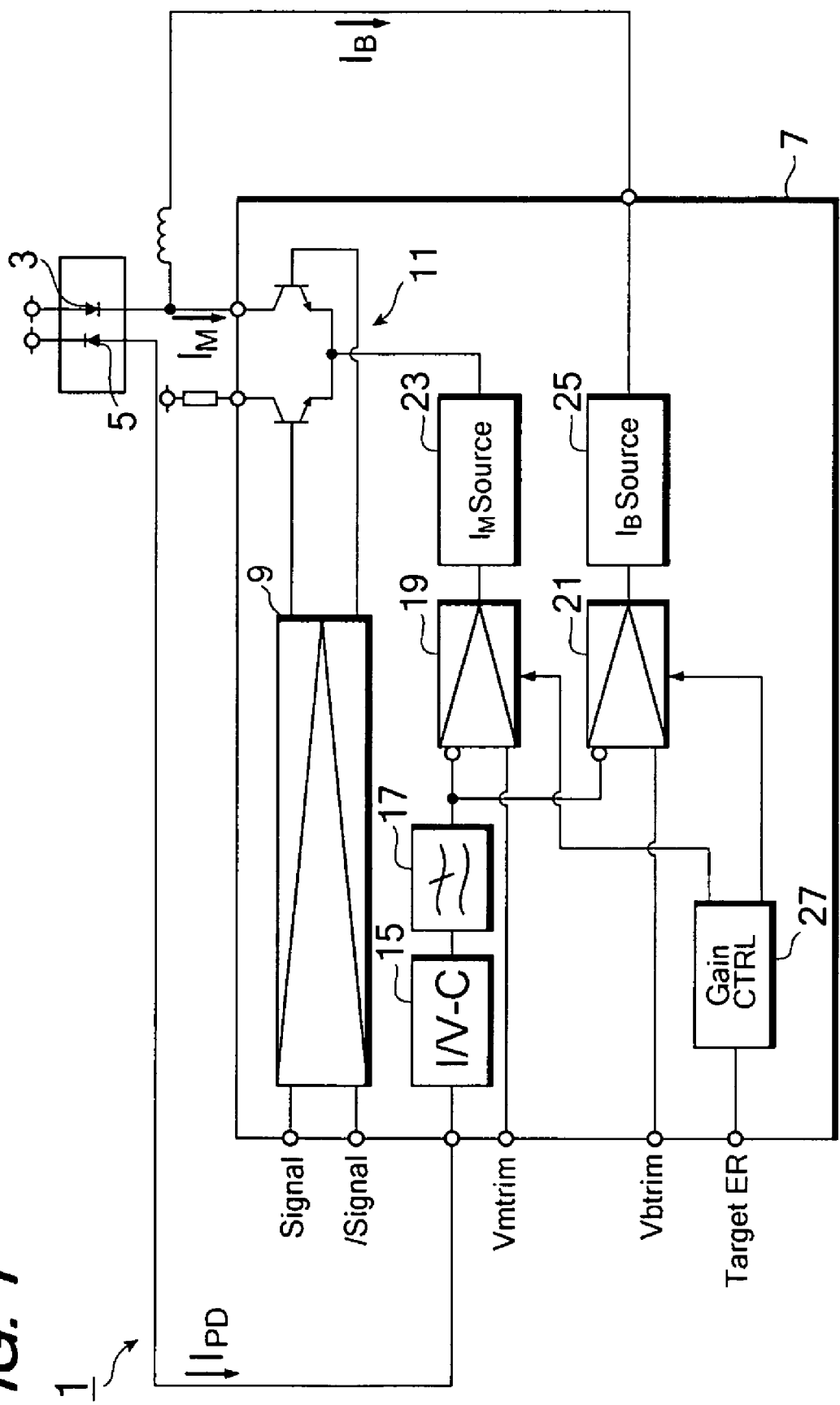
FIG. 1 illustrates a block diagram of an optical transmitter that implements an auto-power control circuit according to the present invention.

FIG. 1 shows an optical transmitter 1 comprising a semiconductor laser diode 3 (LD) that emits signal light, a photodiode (PD) to convert the signal light into corresponding electrical signals by receiving the signal light emitted from the rear facet of the LD 3, and a driver circuit 7 to driver the LD 3. The driver circuit 7 receives external driving signals each having an in-phase and an out-phase at input terminals, an amplifier 9 to amplify the driving signals, and a differential circuit 11 modulates a modulation current $I_M$ provided from the modulation current source 23, which will be described below, by this amplified signal.

The driver circuit 7 further provides an auto-power control (APC) circuit that includes a current-to-voltage converter (I/V-C) 15, an integrator 17, two amplifiers, 19 and 21, the modulation current source 23 and a bias current source 25. The I/V-C 15 converts the photocurrent output from the PD 5 into a voltage signal with a current conversion gain, the integrator 17 integrates this voltage signal, which may be a low-pass filter, one of the amplifier 19 configured to receive an external control signal $V_{mtrim}$ in one of input terminals thereof, to compare it with the integrated signal received in the other input terminal and to output a compared signal to the modulation current source 23, while, the other amplifier 21 configured to receive another external control signal $V_{btrim}$ in one of input terminals thereof, to compare it with the integrated signal received in the other input terminal and to output a compared result to the bias current source 25. The modulation current source 23, by receiving the compared result, outputs a modulation current $I_M$, while, the bias current source 25, by receiving the compared result, outputs a bias current $I_B$ to the LD 3. Thus, the LD 3 is driven by the modulation current $I_M$ and the bias current $I_B$ and the magnitudes of them affect on the optical output.

The transfer function of the LD 3 will be evaluated to explain the negative feedback circuit of the APC circuit 7, which correlates the average output power $P_{ave}$ and the extinction ratio ER of the LD 3 with the operating parameters of the APC circuit 7. First, the monitored current $I_{PD}$ becomes, as shown in FIG. 1, a product of the average output power Pave of the LD 3 and the conversion efficiency $\eta_{PD}$ from the optical to the current of the PD 5;

$$I_{PD}=P_{ave}\cdot\eta_{PD} \quad (1)$$

This monitored current $I_{PD}$ is converted to a voltage signal by the I/V-C 15 and subsequently integrated by the integrator 17. The output voltage $V_{LPF}$ of the integrator 17 becomes, setting that the total gain G includes the current conversion efficiency from the current to the voltage of the I/V-C 15 and the gain of the integrator 17;

$$V_{LPF}=I_{PD}\cdot G \quad (2)$$

Next, the bias current $I_B$ will be investigated. The amplifier 21 compares the output VLPF of the integrator 17 with the external reference signal $V_{btrim}$, and the bias current source 25 outputs the bias current $I_B$, which corresponds to the comparison results by the amplifier 21, to the LD 3. Setting the total gain $G_B$ that includes the gain of the amplifier 21 and the voltage conversion gain from the voltage to the current of the bias current source 25, the bias current $I_B$ becomes, $$I_B=G_B\cdot(V_{btrim}-V_{LPF}) \quad (3)$$

For the modulation current IM, setting the total gain $G_M$ that includes the gain of the amplifier 19 and the voltage conversion gain of the modulation current source 23, the modulation current $I_M$ becomes, $$I_M=G_M\cdot(V_{mtrim}-V_{LPF}) \quad (4)$$

The LD 3, by providing the modulation current $I_M$ and the bias current $I_B$, emits light with a magnitude determined by the slope efficiency $\eta_{LD}$ and an offset current in which the threshold current $I_{th}$ is subtracted from the total current, $I_M+I_B$. Thus, the average output power $P_{AVE}$ becomes;

$$P_{AVE}=\eta_{LD}\cdot(I_B+I_M/2-I_{th}) \quad (5)$$

The maximum power of the optical output $P_{HIGH}$ emitted from the LD 3, which corresponds to the bias current $I_B$ superposed with the whole of the modulation current $I_M$, becomes;

$$P_{HIGH}=\eta_{LD}\cdot(I_B+I_M-I_{th}) \quad (6)$$

While, the minimum power of the optical output $P_{LOW}$, which corresponds to the bias current $I_B$ without any modulation current $I_M$, is given by:

$$P_{LOW}=\eta_{LD}\cdot(I_B-I_{th}) \quad (7)$$

Therefore, the extinction ratio ER becomes;

$$ER=P_{HIGH}/P_{LOW} \quad (8)$$

Deriving the transfer function for the average optical output $P_{ave}$ from equations 1 to 8, $$P_{ave}=\eta_{LD}\cdot(V_{btrim}\cdot G_B+V_{mtrim}\cdot G_M/2-I_{th})/(1+K_B+K_M/2) \quad (9)$$

where, $$K_B=\eta_{PD}\cdot G\cdot G_B\cdot\eta_{LD} \quad (10)$$

$$K_M=\eta_{PD}\cdot G\cdot G_M\cdot\eta_{LD} \quad (11)$$

The extinction ratio ER becomes, $$ER = \{(V_{btrim} - P_{ave}\cdot\eta_{PD}\cdot G)\cdot G_B + (V_{mtrim} - P_{ave}\cdot\eta_{PD}\cdot G)\cdot \quad (12)$$
$$G_M - I_{th}\}/\{(V_{btrim} - P_{ave}\cdot\eta_{PD}\cdot G)\cdot G_B - I_{th}\}$$
$$= \{(1 - K_M/2)\cdot(V_{btrim}\cdot G_B - I_{th}) + (1 + K_B/2)\cdot$$
$$V_{mtrim}\cdot G_M\}/\{(1 + K_M/2)\cdot(V_{btrim}\cdot G_B - I_{th}) -$$
$$K_B/2\cdot V_{mtrim}\cdot G_M\}$$

The parameters relating to the LD 3, such as $\eta_{LD}$ and $I_{th}$, have large temperature dependence among parameters involved in the above equations. Because the former variable $\eta_{LD}$ is contained in both $K_B$ and $K_M$, it is reasonable that only three parameters, $K_B$, $K_M$ and $I_{th}$, show temperature dependence, while, the others may be independent of temperatures. Thus, the extinction ratio ER depends on the closed loop gain $K_M(T)$ for the modulation current $I_M$, the closed loop gain $K_B(T)$ for the bias current $I_B$ and the Threshold current $I_{th}(T)$. When we set the extinction ratio ER to be constant with respect to the temperature, the external reference signal $V_{mtrim}(T)$ should be adjusted so as to set the partial differential of the extinction ratio to be equal to zero, namely $\partial ER/\partial T=0$.

The present invention is to provide a method to control the external reference signal $V_{btrim}$ to set the extinction ratio ER to be independent of the temperatures of the LD with the temperature dependent parameters for the threshold current $I_{th}$ and the slope efficiency $\eta_{LD}$. Accordingly, solving the equation (12) with the external reference signal $V_{mtrim}$ for the modulation current $I_M$, the external reference $V_{mtrim}$ is given by:

$$V_{mtrim} = V_{mtrim}(I_{th}(T), K_B(\eta_{LD}(T), K_M(\eta_{LD}(T))) \quad (13)$$
$$= (V_{btrim}\cdot G_B - I_{th}(T))\cdot\{(ER-1)+(ER+1)\cdot$$
$$K_M(T)2\}/G_M/\{1+(1+ER)\cdot K_B(T)/2\}$$

The external reference $V_{mtrim}(T)$ is a function of two closed loop gains, $K_B(T)$ and $K_M(T)$, and the threshold current $I_{th}(T)$, which means that the reference $V_{mtrim}(T)$ depends on the temperature T of the LD, or the reference $V_{mtrim}(T)$ should be adjusted so as to keep the extinction ratio ER to be independent of the temperature.

Generally, the dispersion of the slope efficiency $\eta_{LD}$ is greater than that of the threshold current $I_{th}$. Accordingly, compensating the dispersion of the slope efficiency $\eta_{LD}$ by adjusting the external reference signal $V_{mtrim}$, the extinction ratio ER may be kept constant with respect to the temperature. The present invention, by setting the ratio of the gain $G_B$ of the amplifier 21 to that $G_M$ of the other amplifier 19 to be a preset value, the extinction ratio ER may be kept constant.

Setting the following relation in the gain of the amplifiers, 19 and 21;

$$G_M = \alpha \cdot G_B \tag{14}$$

Because the closed loop gain $K_M$ for the modulation current $I_M$ and that $K_B$ for the bias current $I_B$ are inherently and solely affected by the slope efficiency $\eta_{LD}$ of the LD 3, the closed loop gains, $K_B$ and $K_M$, may have a relation, $$K_M = \alpha \cdot K_B \tag{15}$$

Then, equation 13 becomes a function of the threshold current $I_{th}$ and the closed loop gain $K_B$ for the bias current;

$$V_{mtrim} = V_{mtrim}(I_{th}, K_B) \tag{13'}$$

The variation of the external reference $\Delta V_{mtrim}$ becomes, $$\Delta V_{mtrim} = \partial V_{mtrim}/\partial I_{th} \cdot \Delta I_{th} + \partial V_{mtrim}/\partial K_B \cdot \Delta K_B \tag{16}$$

When a condition that sets the second term of equation (16) to be zero, $\partial V_{mtrim}/\partial K_B = 0$, the external reference $V_{mtrim}$ is adjusted only for the compensation of the threshold current $I_{th}$. The variation of the external reference $V_{mtrim}$ with respect to the closed loop gain of the bias current $K_B$, which is the coefficient of the second term in equation 16, becomes:

$$\partial V_{mtrim}/\partial K_B = (V_{btrim} \cdot G_B - I_{th}) \cdot (ER+1) \cdot (\alpha - ER + 1) / \tag{17}$$
$$2/G_B/\{1 + (1+ER) \cdot K_B(T)/2\}^2$$
$$\equiv 0$$

Although two conditions, ER=−1 or α=ER−1, satisfies equation (17), the former condition is inconsistent and only the second condition, α=ER−1, do satisfy equation (17). Under such condition, the external reference $V_{mtrim}(T)$ for the modulation current, by inserting a condition $K_M = \alpha \cdot K_B = (ER-1) \cdot K_B$ into equation (13), the following condition may be obtained;

$$V_{mtrim} = (V_{btrim} \cdot G_B - I_{th}(T)) \cdot \{(ER-1) + (ER+1) \cdot (ER-1) \cdot \tag{18}$$
$$K_B(T)/2\}/G_M/\{(1+(1+ER) \cdot K_B(T)/2\}$$
$$= (V_{btrim} \cdot G_B - I_{th}(T)) \cdot (ER-1)/G_M$$

From equation (18) above, the external reference $V_{mtrim}(T)$ is a function of only the threshold current $I_{th}(T)$, accordingly, to adjust the $V_{mtrim}(T)$ to the variation of the threshold current $I_{th}(T)$ may maintain the extinction ratio ER constant to the temperature.

Various applications of the optical transmitter 1 request its individual extinction ratio. However, the gain controller 27 adjusts the gains of the amplifiers, 19 and 21, so as to set the ratio of the gains to relate to the target extinction ratio ER as;

$$G_M/G_B = ER - 1 \tag{19}$$

which may keep the extinction ratio ER of the LD 3 to be stable independent of the temperature.

The analysis herein above may be also applicable to a configuration of the optical transmitter where the LD 3 is coupled in the AC mode with the differential circuit 11. The AC coupled mode modifies the gain $G_M$ of the amplifier in the modulation current loop as a product of $\eta_{mod} \cdot G_M$, where $\eta_{mod}$ is a loss factor by the coupling capacitor between the differential circuit 11 and the LD 3. Thus, the relation between two gains of the amplifiers, 19 and 21, becomes;

$$G_M/G_B = 2 \cdot (ER-1)/(ER+1)/\eta_{mod} \tag{20}$$

which corresponds to the equation (19) defining the relation between two gains, $G_B$ and $G_M$, in the direct couple mode. The LD3, even the modulation current $I_M$ is given by the AC coupled mode, to set the relation between two gains, $G_M$ and $G_B$, of amplifiers, 19 and 21, in respective feedback loops to be those given by equation (20) for the specific extinction ratio ER may reduce the variation with respect to the temperature.

The optical transmitter 1 shown in FIG. 1 provides the gain controller 27 that may adjust the gain $G_M$ for the feedback loop of the modulation current and the gain $G_B$ for the loop of the bias current loop independently. This gain controller 27 receives, from the outside of the optical transceiver, the external signal that contains information of the target extinction ratio to adjust the gains of respective amplifiers, 19 and 21. The gain controller 27, based on thus received target extinction ratio, adjusts the loop gains $K_M$ and $K_B$ for the modulation current $I_M$ and the bias current $I_B$, respectively. A microprocessor may perform the function of the gain controller 27.

Figure 2:
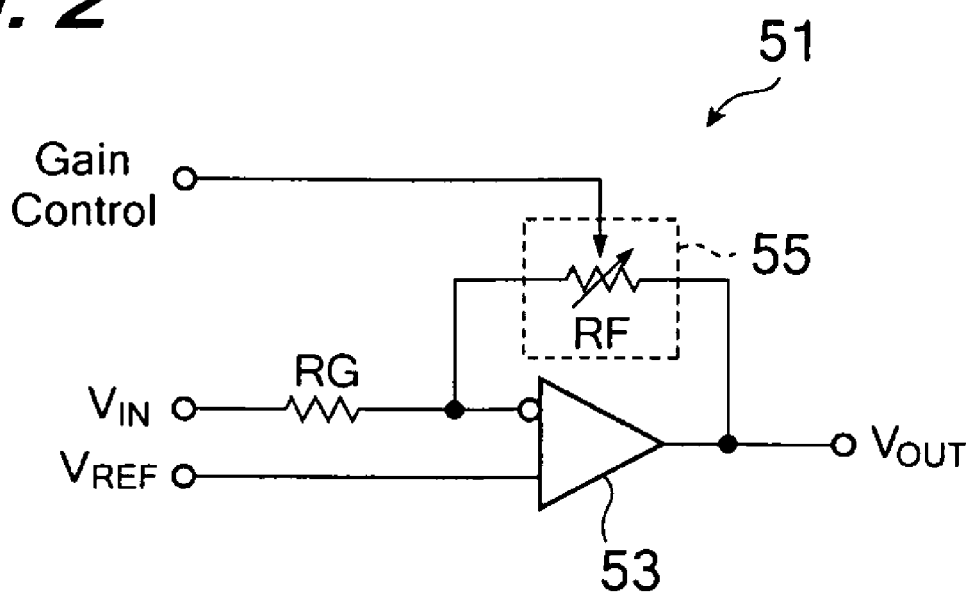
FIG. 2 illustrates an example of a variable gain amplifier implemented in the APC circuit shown in FIG. 1.

FIG. 2 configures an example of a variable gain amplifier 51 applicable to the amplifiers, 19 and 21. This variable gain amplifier 51 includes a differential amplifier 53 and a variable resistor 55 connecting the input of the differential amplifier 53 to the output thereof. The transfer function of this variable gain amplifier 51 is denoted as:

$$V_{OUT} = R_F/R_G \cdot (V_{REF} - V_{IN}) + V_{REF} \tag{21}$$

where the variable resistor 55 may be a digitally controlled resistor whose resistance $R_F$ is adjustable by the gain control signal. This variable gain amplifier 51 may adjust, by applying the digital control signal from the gain controller 27, the loop gain for the modulation and the bias current of the optical transmitter.

Figure 3:
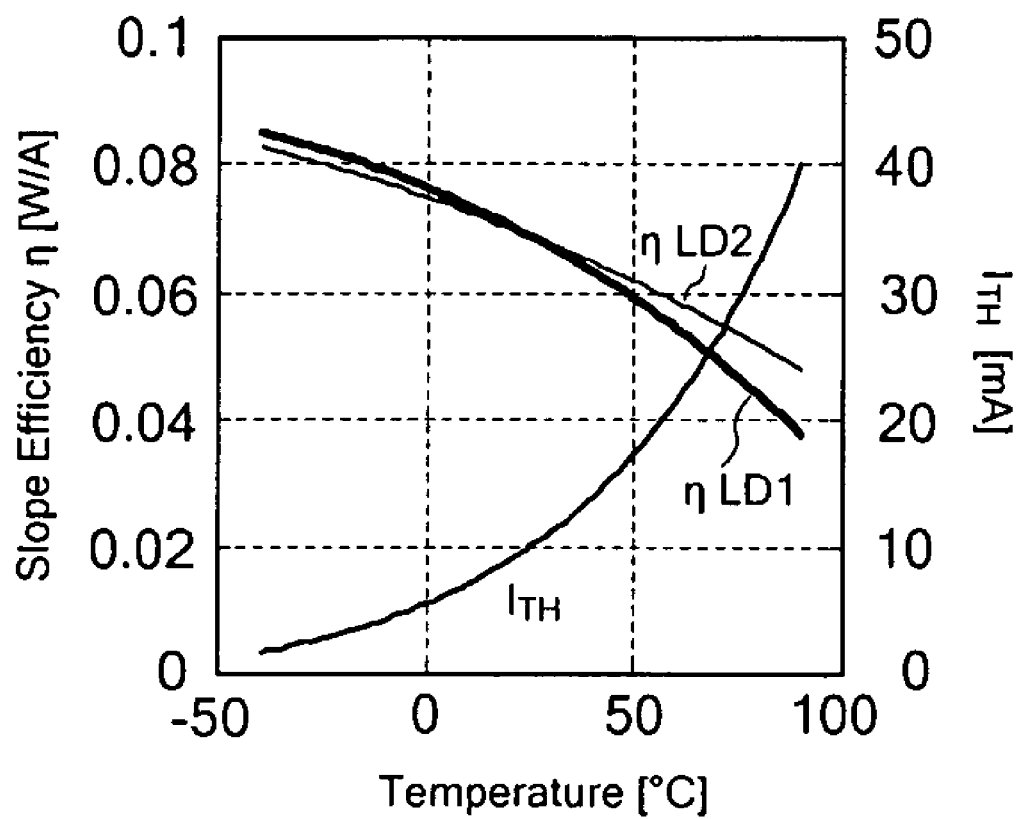
FIG. 3 illustrates a temperature dependence of the threshold current and the slope efficiency of two LDs.

In order to evaluate the function of the present invention, which controls the APC circuit 7 by the ratio of the loop gain $G_M/G_B$, two LDs, LD1 and LD2, are assumed in which the same temperature characteristic in the threshold current $I_{th}$ while the temperature dependence of the slope efficiency $\eta_{LD}$ is different from each other. FIG. 3 illustrates the temperature dependence of the threshold current $I_{th}$, and two slope efficiencies, $\eta_{LD}1$ and $\eta_{LD}2$, for respective LDs. In the evaluation, the parameters in the APC loop 7 are G=2 [V/mA], $\eta_{PD}$=0.9 [A/W] and $V_{btrim}$=1.25 [V], respectively.

First, we assume the gains, $G_B$ and $G_M$, of respective amplifiers, 19 and 21, to be equal and constant, $G_B = G_M = 4$, which corresponds to a conventional configuration of the APC circuit with no relation between the loop gains for the modulation and the bias current and the extinction ratio ER. Evaluating the temperature dependence of the external reference $V_{mtrim}$ so as to keep the extinction ratio for one of the diode, LD1, to be 10 dB, we may obtain a behavior of the external reference $V_{mtrim}$ as shown in FIG. 4A. When two LDs, LD1 and LD2, are driven by this external reference $V_{mtrim}$, the average optical output $P_{AVE}$ and the extinction ratio ER in the temperature dependence thereof become those as shown in FIGS. 4B and 4C. As shown in FIG. 4B, the first diode, LD1, shows the constant extinction ratio ER of 10 dB, while, the other diode, LD2, which has a slope efficiency $\eta_{LD}$ different form that of the first LD, shows the extinction ratio ER considerably deviating from the preset value 10 dB as shown in FIG. 4C.

Figure 5C:
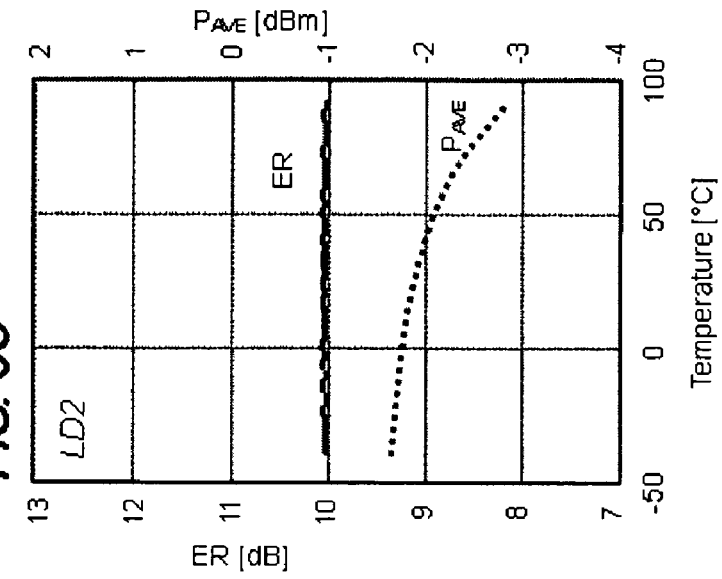
FIGS. 5B and 5C show behaviors of the extinction ratio and the average optical output of the first and the second diodes when the external reference Vmtrim is varied as those shown in FIG. 5A.
Figure 5B:
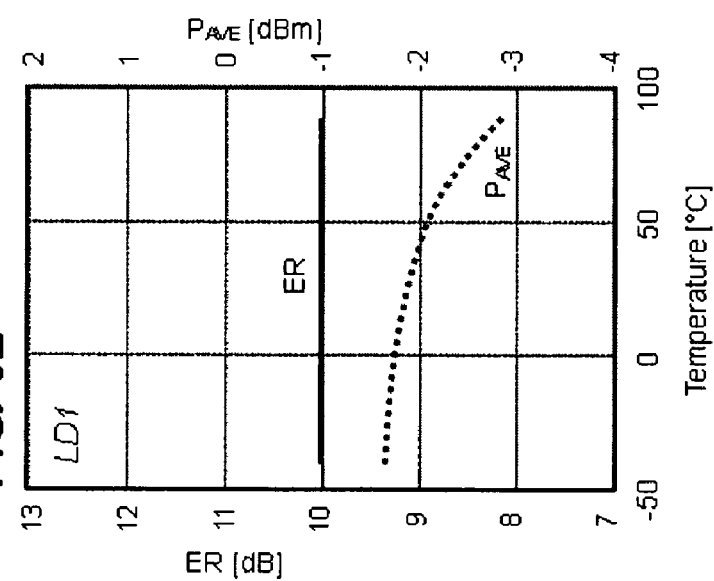
Figure 5A:
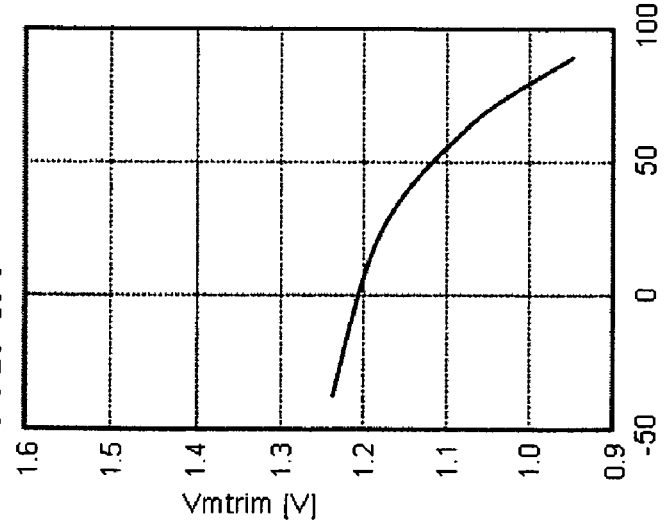
FIG. 5A shows a behavior of the external reference Vmtrim to keep the extinction ratio of the first diode when the gains of respective feedback loops for the modulation and the bias current are set so as to satisfy the relation, $G_M=(ER-1)\cdot G_B$.
Figure 6:
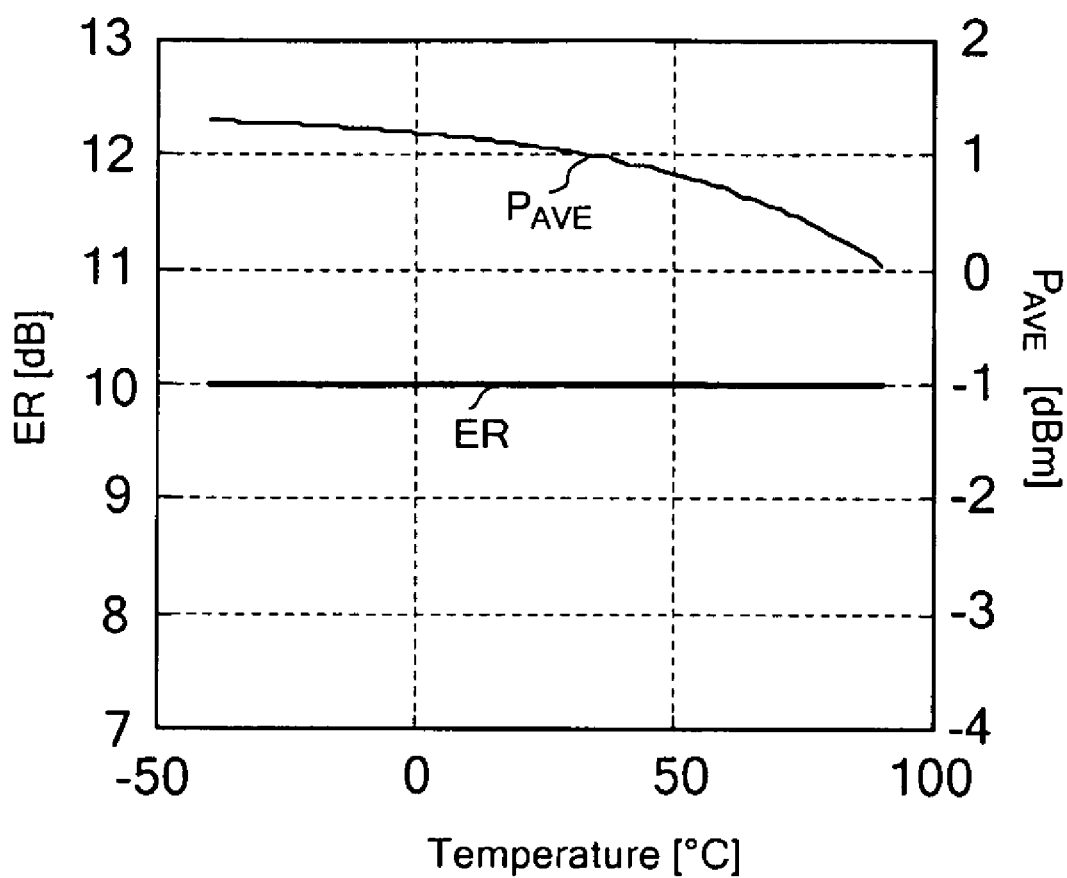
FIG. 6 shows behaviors of the extinction ratio and the average optical output of the optical transmitter when the loop gains for the modulation and the bias currents are set half compared to those shown in FIGS. 5B and 5C but set so as to satisfy the relation with the extinction ratio.

Next, the function according to the present invention will be evaluated. We assume the extinction ratio ER to be 10 dB similar to the analysis for the conventional method above explained and the gains of the amplifiers, 19 and 21, are $G_B=4$ and $G_M=36$ so as to satisfy the relation $G_M/G_B=ER-1$. Evaluating the external reference $V_{mtrim}$, so as to keep the extinction ratio ER for the first diode LD1 to be 10 dB constant with respect to the temperature, FIG. 5A illustrates the behavior of the external reference $V_{mtrim}$. When the other diode LD2 is controlled by this external reference $V_{mtrim}$, the average output power $P_{AVE}$ and the extinction ratio ER thereof are illustrated in FIG. 5C. FIG. 5B illustrates the behaviors of the average optical output $P_{AVE}$ and the extinction ratio ER for the first diode LD1.

As shown in FIG. 5B, the extinction ratio ER for the first diode LD1 behaves constant to be 10 dB as a matter of course. However, for the second diode LD2 with a different slope efficiency $\eta_{LD}$, the behavior of the extinction ratio ER still appears constant to be 10 dB as shown in FIG. 5C. Thus, setting the gains of respective feedback loops so as to satisfy the relation $G_M/G_B=ER-1$, the extinction ratio ER may be kept constant to be 10 dB independent of the temperature characteristic of the slope efficiency $\eta_{LD}$.

Figure 7A:
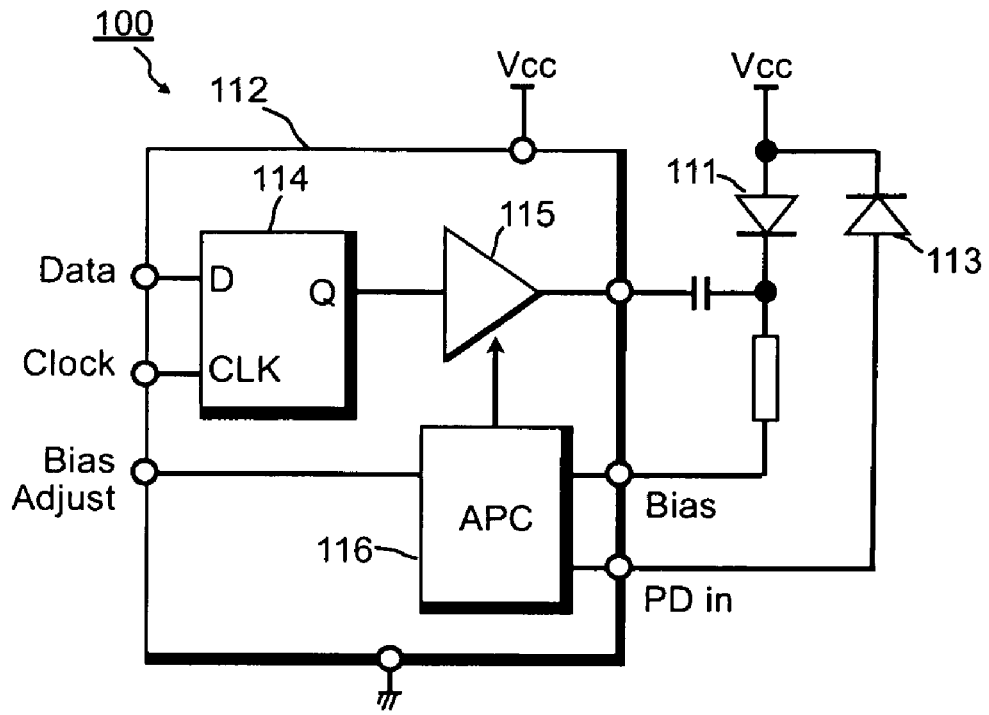
FIGS. 7A and 7B show block diagrams of a conventional optical transmitter with the AC coupling mode between the driver and the LD, and the APC circuit provided therein.
Figure 7B:
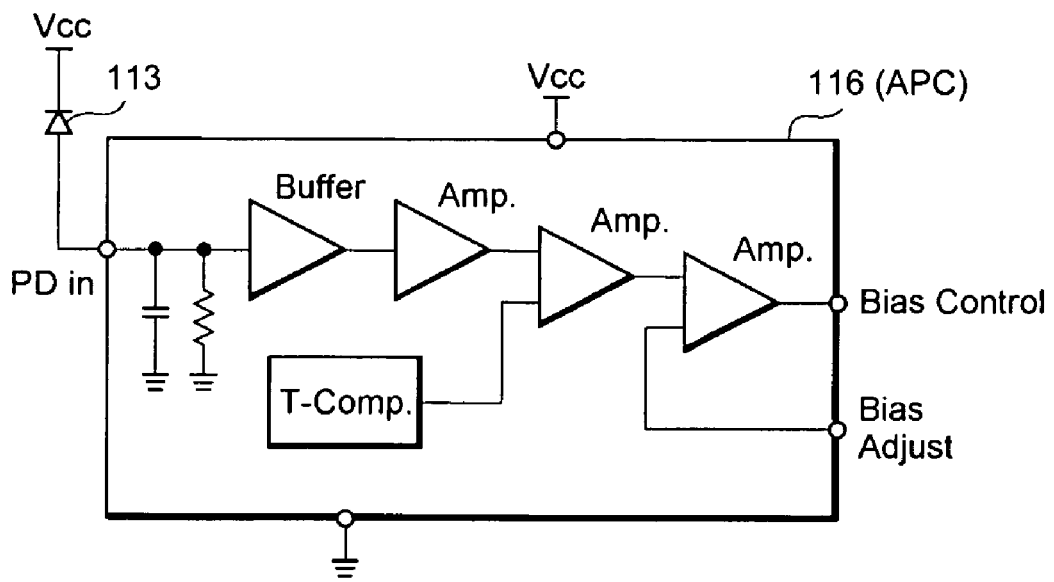
Figure 8:
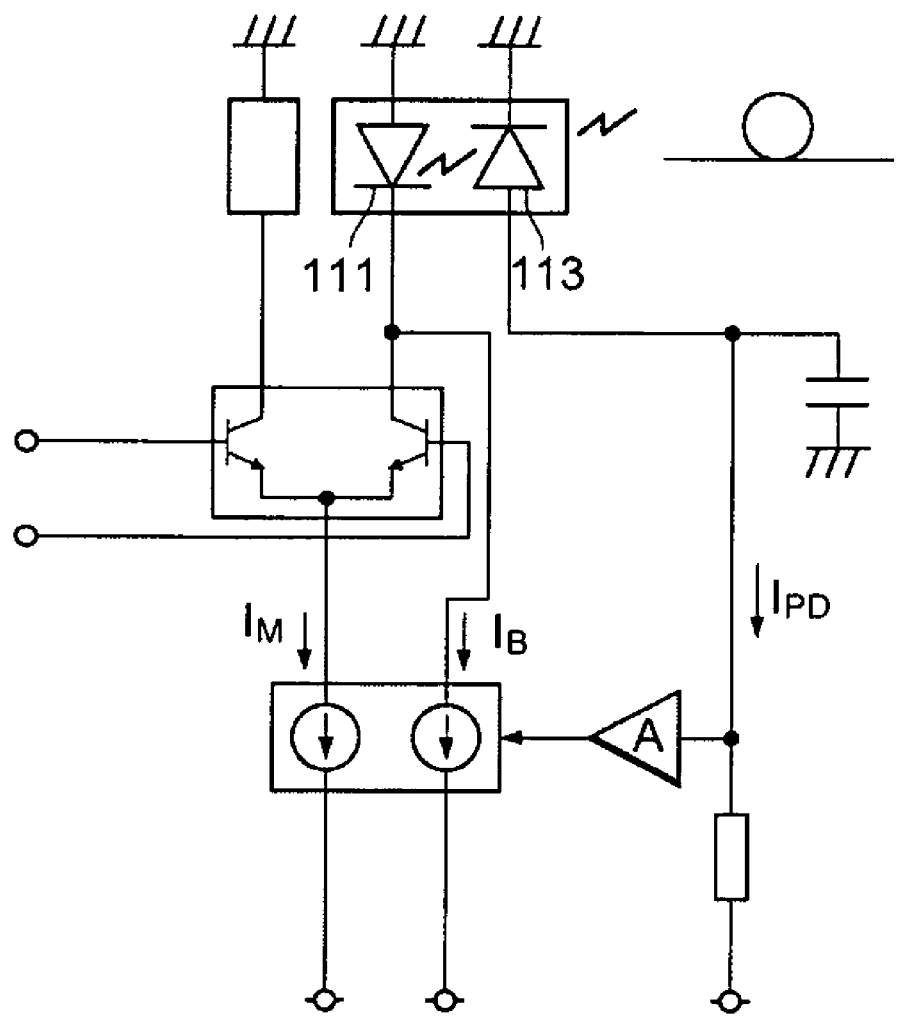
FIG. 8 is a circuit diagram of another convention optical transmitter with the DC coupling mode.

Next, we will investigate a condition where the PD 5 is replaced to one with different conversion efficiency $\eta_{PD}=0.45$, that is, the APC loop gain becomes the half of that assumed in the former analysis, while, the other condition of the gains of the amplifiers are still remained to be $G_B=4$ and $G_M=36$. In this case, the average output power $P_{AVE}$ and the extinction ratio ER in the temperature dependence thereof becomes those shown in FIG. 7, where the average output power $P_{AVE}$ becomes larger due to the reduction of the conversion efficiency $\eta_{PD}$ of the PD 15, while, the extinction ratio ER may be still remained constant to be 10 dB. Thus, it is apparent that the extinction ratio ER may be kept constant to be 10 dB by setting the ratio of the gains of the amplifiers, 19 and 21, in the APC circuit 7 so as to satisfy the relation of $G_M/G_B=ER-1$ independent of the conversion efficiency $\eta_{PD}$ of the monitor PD.

The analysis thus explained above sets the ratio of the gains, $G_M$ and $G_B$, for the closed loop of the modulation and the bias current, respectively, to be a value defined by the target extinction ratio ER, and the gains are adjusted by the amplifiers, 19 and 21. However, the present method may also be carried out in a configuration where the voltage conversion gain from a voltage to a current in respective current sources, 23 and 25, is variable. Moreover, the present method may also be carried out where the other external reference $V_{btrim}$ is variable while the external reference $V_{mtrim}$ is kept constant.

The optical communication systems implementing the optical transmitter 1 occasionally has different specifications of the extinction ratio dependent on the transmission speed and the transmission range thereof. Conventionally, the optical transmitter 1 has to adjust the external reference $V_{mtrim}$ for respective specifications. The method according to the present invention may omit this adjusting procedure of the external reference $V_{mtrim}$ only by setting the loop gains of the APC circuit 7 so as to satisfy the relation, $G_M=(ER-1)\cdot G_B$. Moreover, the external reference $V_{mtrim}$ may inherently depend only on the threshold current $I_{th}(T)$, which may remarkably reduce the influence of dispersed characteristics of the LD.

When the optical transmitter provides a function to be applicable to various applications, the optical transmitter has to follow the variable extinction ratio. Even in such cases, the optical transmitter with the function according to the present invention may stably show the extinction ratio which each application specifies only by adjusting the gains of the amplifiers, $G_M$ and $G_E$, in accordance with the target extinction ratio.

I claim:

1. A method to keep an extinction ratio of an optical output emitted from a laser diode using an auto-power control circuit with first and second feedback loops for a bias current and a modulation current, respectively, said method comprising steps of:

setting closed loop gain of said first feedback loop for said bias current to a first value; and setting closed loop gain of said second feedback loop for said modulation current to a second value, wherein said extinction ratio is ER and a ratio of said second value to said first value is ER−1.

2. The method according to claim 1, wherein said first feedback loop of said bias current includes a photodiode configured to monitor said optical output from said laser diode and to generate a photocurrent, a current-to-voltage converter to convert said photocurrent into a voltage signal, a first amplifier with a first gain to amplify said voltage signal and a bias current source to convert said amplified voltage signal processed by said first amplifier into said bias current with a first voltage conversion gain, said second feedback loop of said modulation current includes said photodiode, said current-to-voltage converter, a second amplifier with a second gain to amplify said voltage signal and a modulation current source to convert said amplified voltage signal processed by said second amplifier into said modulation current with a second voltage conversion gain, and said step for setting said closed loop gain for said first feedback loop is carried out by setting said first gain of said first amplifier and said step for setting said closed loop gain of said second feedback loop is carried out by setting said gain of said second amplifier.

3. The method according to claim 1, wherein said first feedback loop of said bias current includes a photodiode configured to monitor said optical output from said laser diode and to generate a photocurrent, a current-to-voltage converter to convert said photocurrent into a voltage signal, a first amplifier with a first gain to amplify said voltage signal and a bias current source to convert said amplified voltage signal processed by said first amplifier into said bias current with a first voltage conversion gain, said second feedback loop of said modulation current includes said photodiode, said current-to-voltage converter, a second amplifier with a second gain to amplify said voltage signal and a modulation current source to convert said amplified voltage signal processed by said second amplifier into said modulation current with a second voltage conversion gain, and said step for setting said closed loop gain for said first feedback loop is carried out by setting said first voltage conversion gain of said bias current source and said step for setting said closed loop gain of said second feedback loop is carried out by setting said second voltage conversion gain of said modulation current source.

4. An optical transmitter, comprising:
a semiconductor laser diode configured to emit light with a preset extinction ratio provided with a bias current and a modulation current; and
an auto-power control circuit including,
a first feedback loop with a first loop gain to adjust said bias current and
a second feedback loop with a second loop gain to adjust said modulation current,
wherein ER is said preset extinction ratio and a ratio of said second loop gain of said second feedback loop to said first loop gain of said first feedback loop is set to ER−1.

5. The optical transmitter according to claim 4, wherein said first feedback loop includes:
a photodiode configured to monitor said light emitted from said laser diode and to generate a photocurrent with conversion efficiency;
a current-to-voltage converter configured to convert said photocurrent into a voltage signal with a current conversion gain; and
a bias current source configured to convert said voltage signal into said bias current with a first voltage conversion gain,
wherein said first loop gain is determined by said conversion efficiency of said photodiode, said current conversion gain of said current-to-voltage converter, and said first voltage conversion gain of said bias current source.

6. The optical transmitter according to claim 5, wherein said first feedback loop further includes a first amplifier configured to amplify said voltage signal with a first gain and to output a first amplified voltage signal, said bias current source converting said first amplified voltage signal into said bias current with said first voltage conversion gain, and
said first loop gain is determined by said conversion efficiency of said photodiode, said current conversion gain of said current-to-voltage converter, said first gain and said first voltage conversion gain of said bias current source.

7. The optical transmitter according to claim 5, wherein said second feedback loop further includes a second amplifier configured to amplify said voltage signal with a second gain and to output a second amplified voltage signal, said modulation current source converting said second amplified voltage signal into said modulation current with said second voltage conversion gain, and
said second loop gain is determined by said conversion efficiency of said photodiode, said current conversion gain of said current-to-voltage converter, said second gain of said second amplifier and said second voltage conversion gain of said modulation current source.

8. The optical transmitter according to claim 4, wherein said second feedback loop includes:
a photodiode configured to monitor said light emitted from said laser diode and to generate a photocurrent with conversion efficiency;
a current-to-voltage converter configured to convert said photocurrent into a voltage signal with a current conversion gain; and
a modulation current source configured to convert said voltage signal into said modulation current with a second voltage conversion gain,
wherein said second loop gain is determined by said conversion efficiency of said photodiode, said current conversion gain of said current-to-voltage converter, and said second voltage conversion gain of said modulation current source.

* * * * *